(12) United States Patent
Ichikawa

(10) Patent No.: US 7,723,213 B2
(45) Date of Patent: May 25, 2010

(54) MANUFACTURING METHOD OF SEMICONDUCTOR CHIPS AND SEMICONDUCTOR DEVICE HAVING THE SEMICONDUCTOR CHIPS

(75) Inventor: Syunji Ichikawa, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 267 days.

(21) Appl. No.: 11/976,521

(22) Filed: Oct. 25, 2007

(65) Prior Publication Data

US 2008/0105952 A1 May 8, 2008

(30) Foreign Application Priority Data

Nov. 2, 2006 (JP) ............................. 2006-299313

(51) Int. Cl.
H01L 21/46 (2006.01)
(52) U.S. Cl. .............................. 438/464; 257/E25.017; 257/737; 257/777; 438/109; 438/462; 438/613
(58) Field of Classification Search .......... 257/E21.495, 257/E21.597, E23.01, E25.017, 621, 737, 257/777; 438/108, 109, 113, 462, 464, 465, 438/613, 638, 667
See application file for complete search history.

(56) References Cited

U.S. PATENT DOCUMENTS

| | | | | |
|---|---|---|---|---|
| 4,499,655 A * | 2/1985 | Anthony | ...................... | 438/109 |
| 5,229,647 A * | 7/1993 | Gnadinger | .................. | 257/785 |
| 5,432,999 A * | 7/1995 | Capps et al. | ................. | 438/109 |
| 6,087,719 A * | 7/2000 | Tsunashima | ................. | 257/686 |
| 6,168,969 B1 * | 1/2001 | Farnworth | .................. | 438/106 |
| 6,429,096 B1 * | 8/2002 | Yanagida | .................... | 438/459 |
| 6,448,661 B1 * | 9/2002 | Kim et al. | .................... | 257/777 |
| 6,699,787 B2 * | 3/2004 | Mashino et al. | ............. | 438/667 |
| 6,809,421 B1 * | 10/2004 | Hayasaka et al. | ........... | 257/777 |
| 6,873,054 B2 * | 3/2005 | Miyazawa et al. | .......... | 257/774 |
| 6,943,056 B2 * | 9/2005 | Nemoto | ....................... | 438/106 |
| 7,022,609 B2 * | 4/2006 | Yamamoto et al. | .......... | 438/694 |
| 7,091,591 B2 * | 8/2006 | Shibata | ....................... | 257/686 |
| 7,151,009 B2 * | 12/2006 | Kim et al. | .................... | 438/106 |
| 7,179,740 B1 * | 2/2007 | Hsuan | ......................... | 438/667 |
| 7,214,615 B2 * | 5/2007 | Miyazawa | .................. | 438/667 |
| 7,317,256 B2 * | 1/2008 | Williams et al. | ............ | 257/777 |
| 7,402,503 B2 * | 7/2008 | Hara | ........................... | 438/464 |

(Continued)

FOREIGN PATENT DOCUMENTS

JP 2000-243900 9/2000

(Continued)

*Primary Examiner*—Chris C Chu
(74) *Attorney, Agent, or Firm*—Rabin & Berdo, PC

(57) ABSTRACT

A method for manufacturing a semiconductor chip having through electrodes includes forming, in a semiconductor wafer, a plurality of electrode forming holes for forming through electrodes, superimposing bump forming masks formed with a plurality of bump holes over the front and back surfaces of the semiconductor wafer respectively so that the electrode forming holes and the bump holes are brought into alignment, placing the semiconductor wafer with the bump forming masks superimposed thereon over a stage, embedding conductive paste into the bump holes and the electrode forming holes from the bump forming mask disposed over the surface on the side opposite to the stage, of the semiconductor wafer, detaching the bump forming masks from the semiconductor wafer after the conductive paste has been embedded, and dividing the semiconductor wafer into fractions after the bump forming masks have been detached.

11 Claims, 6 Drawing Sheets

U.S. PATENT DOCUMENTS

| | | | |
|---|---|---|---|
| 7,413,979 B2 * | 8/2008 | Rigg et al. | 438/667 |
| 7,595,559 B2 * | 9/2009 | Baek | 257/777 |
| 2002/0110953 A1 * | 8/2002 | Ahn et al. | 438/106 |
| 2005/0017338 A1 * | 1/2005 | Fukazawa | 257/686 |
| 2005/0046002 A1 * | 3/2005 | Lee et al. | 257/678 |
| 2005/0263869 A1 * | 12/2005 | Tanaka et al. | 257/686 |

FOREIGN PATENT DOCUMENTS

| | | |
|---|---|---|
| JP | 2002-050738 | 2/2002 |
| JP | 2004-172453 | 6/2004 |
| JP | 2005-064451 | 3/2005 |
| JP | 2005-093954 | 4/2005 |
| JP | 2006-165073 | 6/2006 |
| JP | 2006-173388 | 6/2006 |
| JP | 2006-261323 | 9/2006 |

* cited by examiner

MANUFACTURING METHOD OF SEMICONDUCTOR CHIPS AND SEMICONDUCTOR DEVICE HAVING THE SEMICONDUCTOR CHIPS

BACKGROUND OF THE INVENTION

The present invention relates to a method for manufacturing semiconductor chips employed in a semiconductor device in which the semiconductor chips are stacked over a lower substrate, and a semiconductor device having the semiconductor chips.

In a conventional semiconductor device, when through electrodes are formed in stacked semiconductor chips, a plurality of bumps are formed in an insulating film formed on a circuit forming surface of a semiconductor wafer, and the surface (called front surface) on the circuit forming surface side thereof is attached or applied onto a support table such as glass using an adhesive such as an UV tape. The back surface of the semiconductor wafer is planarized by grinding or the like so as to be adjusted to a thickness of 50 μm to 200 μm. Using a resist mask in which holes are formed in regions or portions equivalent to the bumps of the front surface, electrode forming holes reaching the bumps are formed by dry etching. An insulating film is formed on the inner faces of the electrode forming holes and the back surface of the semiconductor wafer by a CVD method. A metal mask formed with holes smaller than the electrode forming holes is set onto the insulating film. With it as a mask, the insulating film on the bumps is removed by dry etching. After the removal of the metal mask, an insulating film having holes larger than the electrode forming holes is bonded onto the back surface of the semiconductor wafer. A barrier metal layer that covers over the insulating film and the inner faces of the electrode forming holes and the like is formed by the CVD method or the like. A conductive material is embedded into the electrode forming holes and the holes of the insulating film by a plating method or a metal paste method. Thereafter, the insulating film and the upper layer of the conductive material or the like are chipped off using hard cutting tools, thereby forming the corresponding through electrodes penetrating from the front surface of the semiconductor wafer to the back surface thereof, and the corresponding bumps on both sides thereof (refer to, for example, a patent document 1 (Japanese Unexamined Patent Publication No. 2005-64451 (paragraphs 0030 on seventh path—0045 on ninth page, and FIGS. 1 through 5)).

There is also known one wherein when through plugs are formed in a lower substrate, a protective layer used as a mask for forming plug forming holes is formed in the back surface of a support substrate of a thickness of 250 μm to 550 μm, which is made up of silicon and used for a semiconductor wafer of an SOI structure, and with the protective layer as a mask and an embedded insulating layer as an etching stop layer, plug forming holes are formed by etching, and further, the embedded insulating layer is etched to form dead-end external terminal holes in a silicon layer, and after an insulating film is formed on the inner faces of the plug forming holes and external terminal holes, a conductive material is embedded in the plug forming holes and external terminal holes by a molten metal suction method or a CVD method, followed by removal of the silicon layer and the insulating film provided on external terminals formed at the bottoms of the external terminal holes by etching or the like, thereby forming the corresponding through plugs penetrating from the front surface of the lower substrate to its back surface, and the corresponding external terminals (refer to, for example, a patent document 2 (Japanese Unexamined Patent Publication No. 2005-93954 (paragraphs 0026 on seventh page—0035 on eighth page, and FIG. 2)).

Thinning of semiconductor chips is proceeding in recent years. A semiconductor wafer whose thickness is set to about 30 μm to 70 μm has been used as a semiconductor wafer for manufacturing the semiconductor chips.

However, the technology of the patent document 1 referred to above involves the problems that since the front surface of the semiconductor wafer formed with the bumps is attached onto the support table using the adhesive, and the through electrodes and the bumps on the back surface side are formed in this state, the bumps on the front surface side adhere to the adhesive and are hence hard to peel off when the semiconductor wafer is peeled off from the support table, thus causing dropping off of the bumps on the front surface side and cracking of the semiconductor wafer, whereby the yields of the semiconductor wafer are degraded.

This is brought to the fore particularly where the semiconductor wafer is brought into thin-plate form to manufacture the thinned semiconductor chips.

Since the conductive material is embedded into the holes of the insulating film on the back surface of the semiconductor wafer and thereafter the insulating film and the upper layer of the conductive material or the like are chipped off using the hard cutting tools, a back surface planarizing process step becomes necessary to form the bumps on the back surface side for the through electrodes, thereby causing a problem in that the process of manufacturing the through electrodes becomes complex.

SUMMARY OF THE INVENTION

The present invention has been made to solve the above problems. An object of the present invention is to provide means that enhances yields of a semiconductor wafer at the formation of through electrodes in a semiconductor chip and simplifies its manufacturing process.

According to one aspect of the present invention, for attaining the above object, there is provided a method for manufacturing a semiconductor chip having through electrodes, comprising the steps of forming, in a semiconductor wafer having front and back surfaces formed with circuits, a plurality of electrode forming holes for forming the through electrodes, superimposing bump forming masks formed with a plurality of bump holes over the front and back surfaces of the semiconductor wafer respectively in such a manner that the electrode forming holes and the bump holes are brought into alignment, placing the semiconductor wafer with the bump forming masks superimposed thereon over a stage, embedding conductive paste into the bump holes of the bump forming masks superimposed over the front and back surfaces and the electrode forming holes of the semiconductor wafer from the bump forming mask disposed over the surface on the side opposite to the stage, of the semiconductor wafer, detaching the bump forming masks from the semiconductor wafer after the conductive paste has been embedded, and dividing the semiconductor wafer into fractions after the bump forming masks have been detached.

Thus, the present invention obtains advantageous effects in that after a semiconductor wafer has been brought into thin-plate form, through electrodes and bumps on both sides thereof can be formed, dropping off of the bumps and cracking of the semiconductor wafer can be prevented and the yields of the semiconductor wafer for manufacturing each semiconductor chip can be enhanced, and that the process of flattening or planarizing ends faces of the bumps becomes unnecessary and a manufacturing process at the formation of the through electrodes in the semiconductor chip can be simplified.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of a method for manufacturing semiconductor chips according to the present invention and a semiconductor device having the semiconductor chips will hereinafter be described with reference to the accompanying drawings.

First Preferred Embodiment

Figure 1:
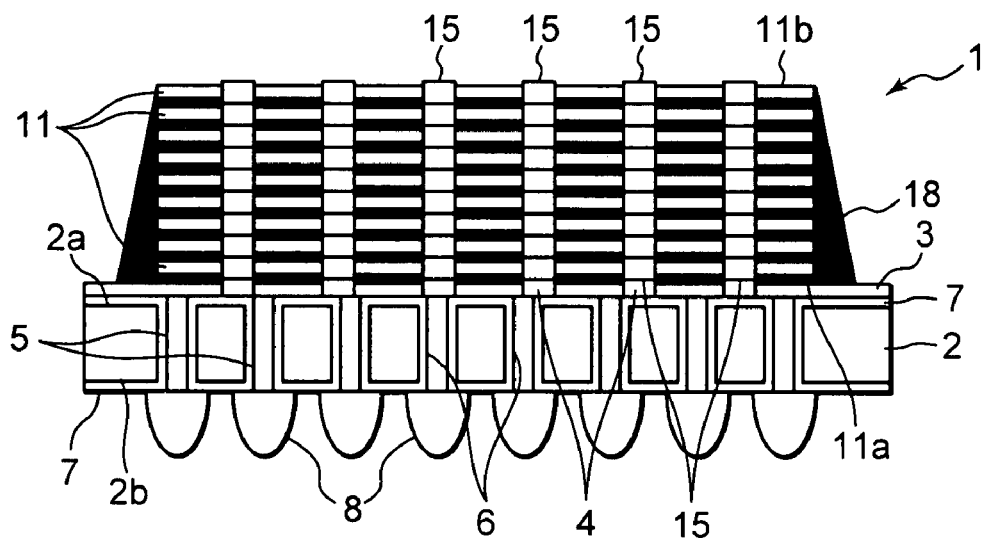
FIG. 1 is an explanatory diagram showing a section of a semiconductor device of a first embodiment.
Figure 2:
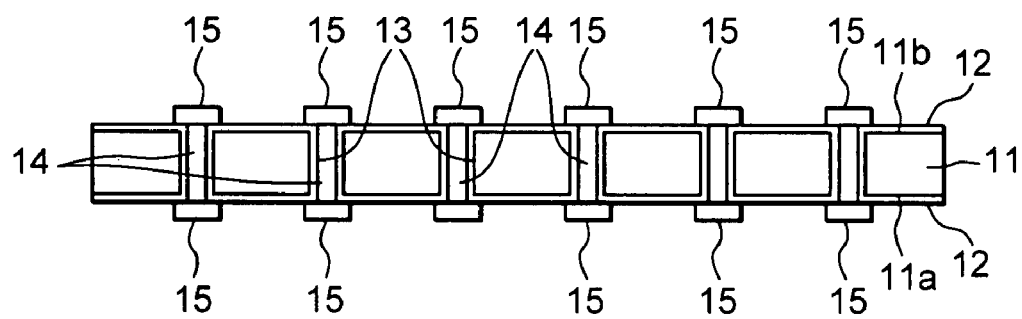
FIG. 2 is an explanatory diagram illustrating a section of a semiconductor chip according to the first embodiment.

FIG. 1 is an explanatory diagram showing a section of a semiconductor device illustrative of a first embodiment, FIG. 2 is an explanatory diagram showing a section of a semiconductor chip employed in the first embodiment, FIG. 3 is an explanatory diagram showing a method for manufacturing the semiconductor chips employed in the first embodiment, and FIG. 4 is an explanatory diagram showing a method for manufacturing the semiconductor device illustrative of the first embodiment, respectively.

In FIG. 1, reference numeral 1 indicates the semiconductor device.

Reference numeral 2 indicates a lower substrate or board, which is a plate-shaped member formed of silicon (Si). Unillustrated wiring patterns constituted of a plurality of wirings, which are covered with an insulating layer 3 formed of polyimide or the like, are formed in its front surface 2a. Connecting terminals 4 that protrude from the insulating layer 3 are respectively formed at predetermined regions or portions on the wiring patterns.

Reference numerals 5 indicate through plugs which are formed by embedding a conductive material such as copper (Cu) in plug forming holes 6 formed so as to penetrate from the front surface 2a of the lower substrate 2 to its back surface 2b. The through plugs 5 are electrically connected to their corresponding wiring patterns in the front surface 2a.

Reference numeral 7 indicates an oxide film. The oxide film 7 is a film having an insulating property, which consists of silicon oxide ($SiO_2$) formed between the side face of each plug forming hole 6 and the through plug 5 and formed in the front surface 2a of the lower substrate 2.

Reference numerals 8 indicate external terminals, which are hemispherical terminals each formed on an end surface on the back surface 2b side, of the through plug 5 by a tin-lead (SnPb) alloy, a tin-silver (SnAg) alloy or the like by means of a solder ball method or the like. The external terminals 8 are joined or bonded to wiring terminals of an unillustrated mounting board. Each of the external terminals 8 has the function of electrically connecting the semiconductor device 1 and the mounting board.

In FIG. 2, designated at numeral 11 is a semiconductor chip. A plurality of circuit elements for the semiconductor chip 11 are formed on the its front surface 11a side.

Reference numeral 12 indicates an insulating film, which is a film having an insulating property, comprised of silicon oxide, silicon nitride ($Si_3N_4$), polyimide or the like, which film is formed on the front and back surfaces 11a and 11b of the semiconductor chips 11 and the side faces of a plurality of electrode forming holes 13 corresponding to through holes each penetrating from the front surface 11a formed in the semiconductor chip 11 to its back surface 11b.

Reference numerals 14 indicate through electrodes, which are formed by embedding a conductive material into the electrode forming holes 13 lined with the insulating film 12 of the semiconductor chip 11. Bumps 15 formed of the same conductive material are respectively formed on their corresponding end faces on the front and back surfaces 11a and 11b sides. The front surface 11a and each bump 15 on the back surface 11b side are electrically connected to each other by the corresponding through electrode 14.

The through electrodes 14 and the bumps 15 on both sides thereof employed in the present embodiment are formed by thermally curing paste-like conductive paste 16 containing a conductive material such as silver (Ag) or copper.

As shown in FIG. 1, the semiconductor device 1 according to the present embodiment is a ball grid array (BGA) having a three-dimensional structure, wherein the bumps 15 on the side of one surface, e.g., the front surface 11a of the semiconductor chip 11 are respectively joined to the connecting terminals 4 formed in the front surface 2a of the lower substrate 2, the bumps 15 formed on the front surface 11a side of other semiconductor chip 11 are joined to their corresponding bumps 15 formed on the back surface 11b side corresponding to the surface located on the opposite side of the semiconductor chip 11, thus laminating a plurality of semiconductor chips 11 on the lower substrate 2, and an underfill layer 18 is formed by charging an underfill resin such as an epoxy resin having an insulating property, which is shown in FIG. 1 with hatching, between the laminated semiconductor chips 11.

In FIG. 3, reference numeral 21 indicates a semiconductor wafer, which is a circular silicon substrate for forming the semiconductor chip 11 according to the present embodiment simultaneously in plural form.

Reference numerals 22 indicate alignment holes, which are through holes for alignment formed at plural spots of the outer peripheral edge of the semiconductor wafer 21. Reference numeral 24 indicates a support table, which is formed of a glass plate (having a thickness ranging from 0.5 mm to 1 mm in the present embodiment). The support table 24 has the function of supporting the semiconductor wafer 21 when the back surface 21b of the semiconductor wafer 21 is polished.

In the present embodiment, a semiconductor wafer 21 thin-plated with a thickness of 30 μm to 70 μm by back grinding is used.

Reference numeral 25 indicates an adhesive layer, which is formed by applying a UV-cure type or thermosetting adhesive onto the support table 24 and curing the same after the semiconductor wafer 21 is caused to adhere thereto. The adhesive layer 25 has the function of applying the semiconductor wafer 21 onto the support table 24.

The adhesive layer 25 employed in the present embodiment is formed with a thickness of 20 μm to 100 μm.

Reference numerals 26 indicate bump forming masks, each of which is a sheet-like member formed of a thin metal plate (of an about 30 μm-thick in the present embodiment) and having a diameter larger than the semiconductor wafer 21. The bump forming mask 26 has bump holes 27 corresponding to through holes each having such a size as to internally include the electrode forming hole 13, which bump holes are formed at the same positions as those of the electrode forming holes 13 formed in the semiconductor wafer 21. Further, the bump forming mask 26 has registration holes 28 (first registration holes) corresponding to through holes nearly equal in size to the alignment holes 22, which registration holes 28 are formed at the same positions as those of the alignment holes 22 formed in the semiconductor wafer 21. The bump forming mask 26 functions as a mask member used when the bumps 15 of the present embodiment are formed.

A method of manufacturing semiconductor chips according to the present embodiment will be explained below in accordance with processes indicated in FIG. 3A to 3F.

Figure 3A:
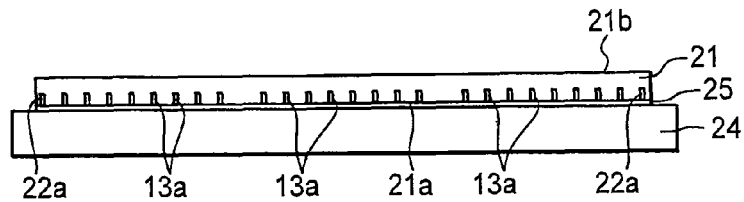
FIGS. 3A-3F are an explanatory diagrams depicting a method for manufacturing the semiconductor chips according to the first embodiment.

In FIG. 3A, an oxide film comprised of silicon oxide is formed on its corresponding front surface 21a of the semiconductor wafer 21 by a thermal oxidation method or a CVD (Chemical Vapor Deposition) method. A resist mask that has exposed areas for forming a plurality of through electrodes 14 and alignment holes 22 is formed on the oxide film. With it as a mask, the oxide film is etched by anisotropic etching to expose the front surface 21a of the semiconductor wafer 21 in the areas for forming the through electrodes 14 and the alignment holes 22. After the removal of the resist mask, the semiconductor wafer 21 is etched by anisotropic etching with the exposed oxide film as a mask to form dead-end deep holes 13a and 22a each having a depth of 50 μm to 100 μm, for forming the electrode forming holes 13 and the alignment holes 22 in the front surface 21a.

An UV-cure type thermosetting adhesive is applied onto the support table 24. The front surface 21a of the semiconductor wafer 21 with the deep holes 13a and 22a formed therein is adhered to the adhesive. The adhesive is cured to form an adhesive layer 25, and the semiconductor wafer 21 is applied onto the support table 24.

Figure 3B:

In FIG. 3B, after the application of the semiconductor wafer 21 onto the support table 24, the back surface 21b of the semiconductor wafer 21 is ground or polished by a grinding stone to bring into thin-plate form with a thickness of 30 μm to 70 μm and open the back surface 21a sides of the deep holes 13a and 22a onto the back surface 21a, thereby forming a plurality of the electrode forming holes 12 and alignment holes 22 corresponding to through holes that penetrate the semiconductor wafer 21 in its thickness direction.

Figure 3C:
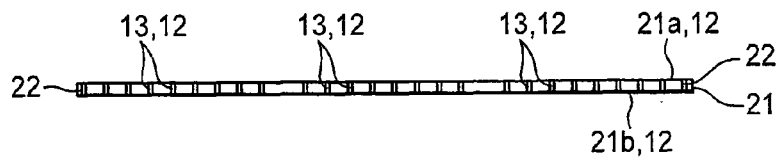

In FIG. 3C, the semiconductor wafer 21 formed with the electrode forming holes 13 and the alignment holes 22 is peeled off from the adhesive layer 25 using a release agent or remover. Silicon oxide is deposited by the CVD method to form an insulating film 12 on the front and back surfaces 21a and 21b of the semiconductor wafer 21 and the respective side faces of the electrode forming holes 13, and the like.

Figure 3D:
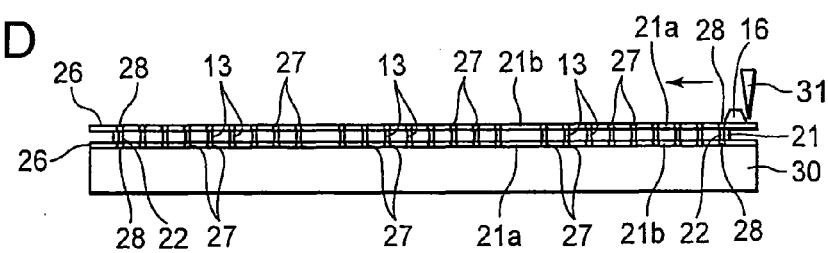

In FIG. 3D, bump forming masks 26 are placed on a stage 30. By means of optical alignment using the registration holes 28 formed in the bump forming masks 26 and the alignment holes 22 formed in the semiconductor wafer 21, one surface, e.g., the front surface 21a of the semiconductor wafer 21 formed at the process P3 is superimposed or overlaid on its corresponding bump forming mask 26 to overlay the semiconductor wafer 21 on the bump forming mask 26. Similarly, another bump forming mask 26 is superimposed on the back surface 21b of the semiconductor wafer 21. These are pressed against the stage 30 to place the semiconductor wafer 21 in which the bump forming masks 26 are respectively superimposed on their corresponding front and back surfaces, on the stage 30.

At this time, the respective bump holes 27 of the bump forming masks 26 placed on the front and back surfaces are brought into alignment with positions where the electrode forming holes 13 formed in the semiconductor wafer 21 are internally included, by the alignment using the registration holes 28 and the alignment holes 22.

Then, conductive paste 16 is applied onto the bump forming mask 26 superimposed on the side (back surface 21b side in the present embodiment) opposite to the stage 30, of the semiconductor wafer 21. This is enlarged by a spatula-like jig 31, whereby the conductive paste 16 is embedded into the bump holes 27 of the bump forming mask 26 superimposed on the front surface 21a, the electrode forming holes 13 of the semiconductor wafer 21, and the bump holes 27 of the bump forming mask 26 overlaid on the back surface 21b.

Figure 3E:
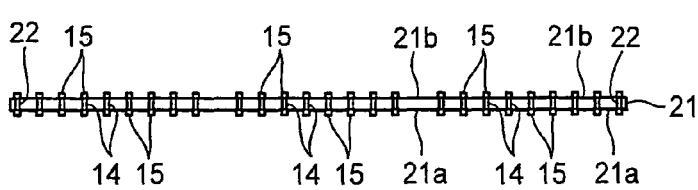

In FIG. 3E, the pressing against the two bump forming masks 26 and the semiconductor wafer 21 placed on the stage 30 is released to detach the bump forming masks 26 with the conductive paste 6 embedded therein and the semiconductor wafer 21 from on the stage 30. After the bump forming masks 26 are detached from the front surface 21a and the back surface 21b of the semiconductor wafer 21, the conductive paste 16 is cured by heat treatment or annealing to form through electrodes 14 extending through the semiconductor wafer 21 and bumps 15 connected to their corresponding end faces on the front surface 21a side and the back surface 21b side.

Figure 3F:
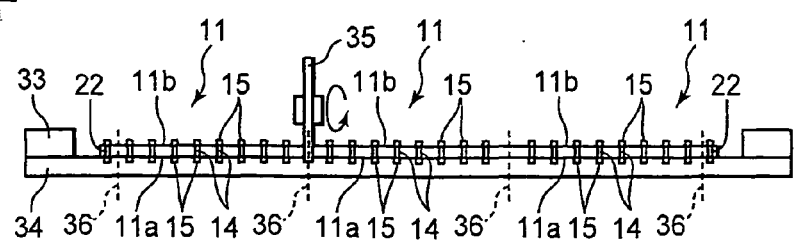

In FIG. 3F, one surface, e.g., the front surface 21a of the semiconductor wafer 21 formed at the process P5 is applied onto a dicing tape 34 bonded to a dicing ring 33. Dividing or dicing lines 36 indicated by broken lines in FIG. 3F, which are set to the semiconductor wafer 21, are cut from thereabove by a dicing blade 35 to divide the semiconductor wafer 21 into fractions in units of semiconductor chips 11.

Thereafter, the fractionalized semiconductor chips 11 are peeled off from the dicing tape 34 to form each semiconductor chip 11 shown in FIG. 2.

The semiconductor chips 11 manufactured in this way are laminated on the front surface 2a side of the lower substrate 2.

A method for manufacturing a semiconductor device according to the present embodiment will be explained below in accordance with processes indicated in FIG. 4A to 4D.

Figure 4A:
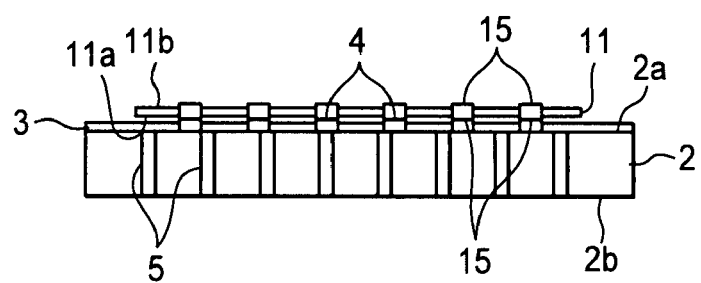
FIGS. 4A-4D are explanatory diagrams showing a method for manufacturing the semiconductor device according to the first embodiment.

In FIG. 4A, each individually divided lower substrate 2 in which wiring patterns covered with an insulating layer 3 are formed in its front surface 2a, and connecting terminals 4 electrically connected to the wiring patterns and formed on the front surface 2a side and through plugs 5 electrically connected to the wiring patterns and penetrating from the front surface 2a to its back surface 2b, are formed, is prepared. Bumps 15 formed on the side of one surface, e.g., the front surface 11a of each semiconductor chip 11 are placed on their corresponding connecting terminals 4 in alignment. The bumps 15 are molten by heat treatment and/or ultrasound to bond the bumps 15 of the semiconductor chip 11 corresponding to the bottom layer and the connecting terminals 4 of the lower substrate 2 to one another.

Figure 4B:
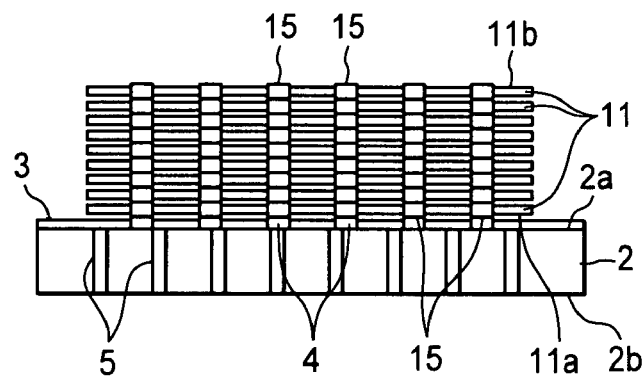

In FIG. 4B, after the bonding of the semiconductor chip 11 of the bottom layer to the lower substrate 2, bumps 15 on the front surface 11a side of a semiconductor chip 11 corresponding to a second layer are placed on their corresponding bumps 15 on the back surface 11b side of the semiconductor chip 11 of the bottom layer in alignment. The bumps 15 of both semiconductor chips are molten by heat treatment and/or ultrasound to bond the semiconductor chip 11 of the second layer to its corresponding semiconductor chip.

This bonding of the semiconductor chips 11 are repeated in sequence, whereby a plurality of semiconductor chips 11 electrically connected to their corresponding wiring patterns of the lower substrate 2 are laminated on the front surface 2a side of the lower substrate 2.

Figure 4C:
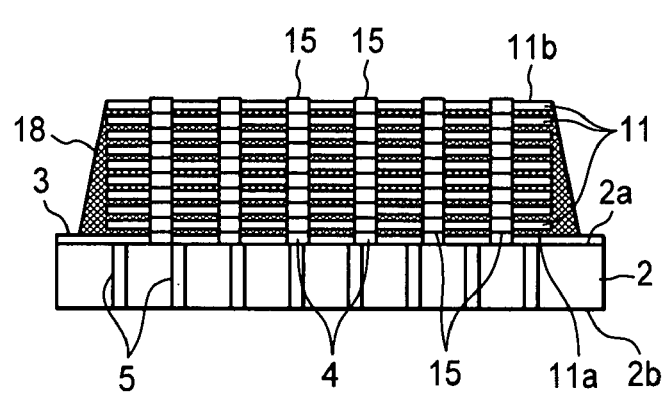

In FIG. 4C, the lower substrate 2 with the laminated semiconductor chips 11 mounted thereon is mounted to an unillustrated mold. A liquid underfill resin is injected to charge between the laminated semiconductor chips 11, between the semiconductor chip 11 of the bottom layer and the lower substrate 2 and around the laminated semiconductor chips 11, followed by being thermally cured, thereby forming an underfill layer 18.

Thus, the laminated semiconductor chips 11, and the semiconductor chip 11 of the bottom layer and the lower substrate 2 are respectively bonded to one another by adhering action of the underfill layer 18, and insulation is made between their bonded bumps 15 in the plane direction.

Figure 4D:
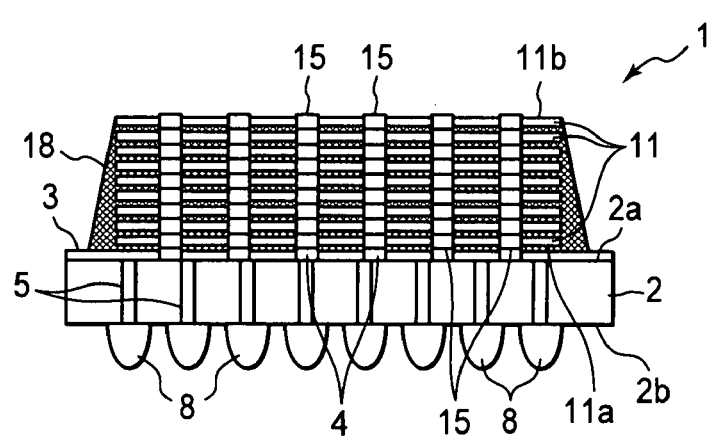

In FIG. 4D, the underfill layer 18 is cooled and thereafter a semiconductor device 1 formed with the underfill layer 18 formed therein is taken out from the mold. External terminals 8 respectively connected to end faces of through plugs 5 are formed on the back surface 2a side of the lower substrate 2 by a solder ball method or the like.

The semiconductor device 1 in which the semiconductor chips 11 are laminated over the lower substrate 2 shown in FIG. 1 is manufactured in this way.

In each semiconductor chip 11 according to the present embodiment as described above, the semiconductor wafer 21 is brought into thin-plate form by grinding and peeled off from the adhesive layer 25. Thereafter, the conductive paste 16 is embedded using the bump forming masks 26 to form the bumps 15 and through electrodes 14. Therefore, it is possible to prevent dropping off of the bumps 15 and cracking of the semiconductor wafer 21 without adhesion of the adhesive layer 25 to the bumps 15 and to enhance the yields of the semiconductor wafer 21.

This is particularly effective in the semiconductor wafer 21 for manufacturing the semiconductor chips 11 brought into less thickness.

Since the alignment holes 22 are provided in the semiconductor wafer 21 and the registration holes 28 are provided in the bump forming masks 26, respectively, the alignment between the bump holes 27 of the bump forming masks 26 and the electrode forming holes 13 of the semiconductor wafer 21 can be done with satisfactory accuracy, and poor connections between the through electrodes 14 and the bumps 15 due to position displacements are prevented. Thus, the bumps 15 excellent in position accuracy can be formed.

Further, the bump forming masks 26 are superimposed on the front and back surfaces of the semiconductor wafer 21, and the conductive paste 16 is embedded. Thereafter, the bump forming masks 26 are detached and the bumps 15 are formed on the front and back surfaces of the semiconductor wafer 21. Therefore, the flattening or planarizing process of the end faces of the bumps 15, such as the back surface flattening step or the like becomes unnecessary, and the manufacturing process of each semiconductor chip 11 can be simplified.

In the present embodiment as described above, the bump forming masks having the bump holes each having such a size as to internally include each electrode forming hole are respectively provided on the stage so as to be superimposed on the front and back surfaces of the semiconductor wafer. The conductive paste is embedded into the bump holes of the bump forming masks overlaid on the front and back surfaces and the electrode forming holes of the semiconductor wafer from the bump forming mask side on the surface located on the side opposite to the stage. Then, the bump forming masks are detached and the conductive paste is cured. Thereafter, the semiconductor wafer is divided into the fractions, thereby manufacturing the semiconductor chips. Therefore, the through electrodes and the bumps located on both sides thereof can be formed after the semiconductor wafer has been brought into thin-plate form. It is also possible to prevent dropping off of the bumps and cracking of the semiconductor wafer and enhance the yields of the semiconductor wafer for manufacturing the thinned semiconductor chips. Further, the flattening process of the end faces of the bumps becomes unnecessary and the manufacturing process at the formation of the through electrodes in each semiconductor chip can be simplified.

Second Preferred Embodiment

Figure 5:
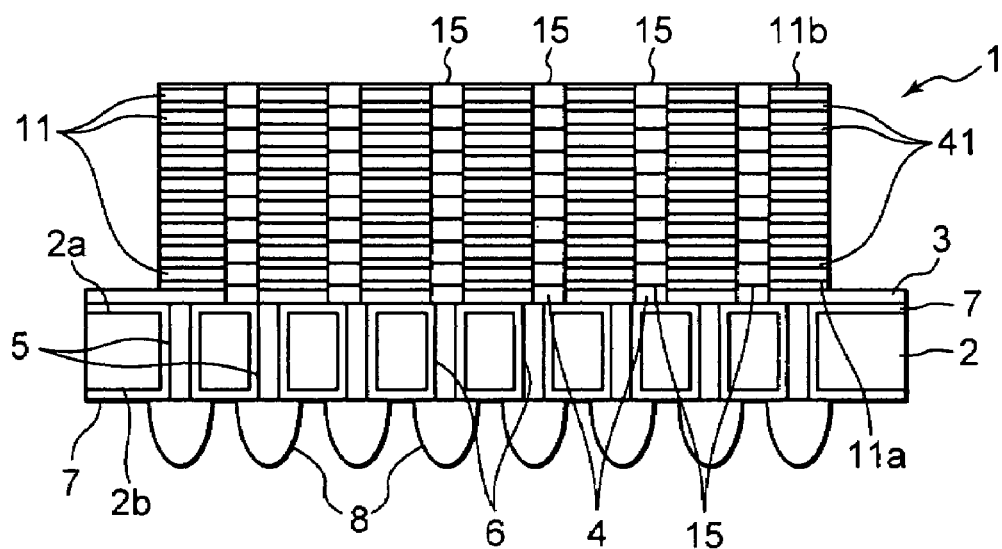
FIG. 5 is an explanatory diagram illustrating a section of a semiconductor device of a second embodiment.
Figure 6:
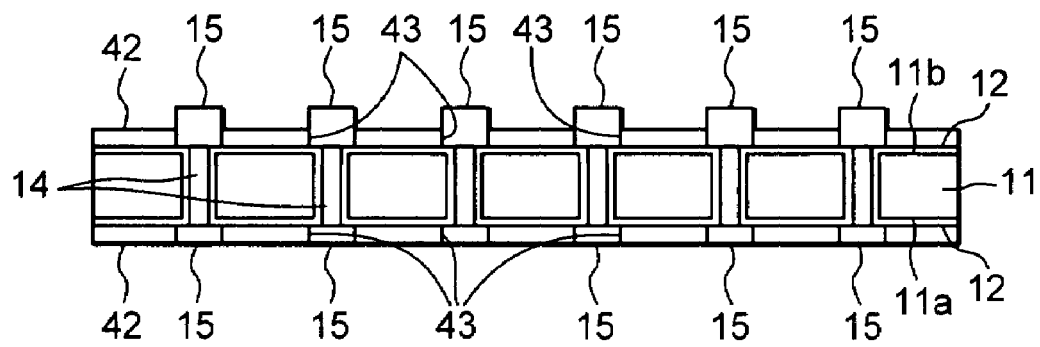
FIG. 6 is an explanatory diagram showing a section of a semiconductor chip according to the second embodiment.

FIG. 5 is an explanatory diagram showing a section of a semiconductor device according to a second embodiment, FIG. 6 is an explanatory diagram showing a section of a semiconductor chip employed in the second embodiment, FIG. 7 is an explanatory diagram showing a method for manufacturing the semiconductor chips employed in the second embodiment, and FIG. 8 is an explanatory diagram showing a method for manufacturing the semiconductor device illustrative of the second embodiment, respectively.

Incidentally, portions similar to those of the first embodiment are respectively given the same reference numerals, and their description will therefore be omitted.

In FIG. 5, reference numerals 41 indicate insulating resin layers, which are layers having insulating properties formed by depositing or welding insulating sheets 42 laminated onto front and back surfaces 11a and 11b of the semiconductor chip 11 shown in FIG. 6 by heat treatment or annealing. The insulating resin layers 41 bond the stacked respective semiconductor chips 11, and the semiconductor chip 11 of the bottom layer and its corresponding lower substrate 2 by adhering action thereof, and have the function of insulating between their bonded bumps 15.

As shown in FIGS. 6 and 7, each of the insulating sheets 42 is a sheet-like member having a diameter nearly equal to a semiconductor wafer 21, which is formed of a thin resin sheet (of an about 20 μm-thick in the present embodiment) having an insulating property, such as polyimide. In a manner similar to the bump forming mask 26 of the first embodiment, openings 43 corresponding to through holes each having such a size as to internally include an electrode forming hole 13 are formed at the same positions as those of the electrode forming holes 13 formed in the semiconductor wafer 21. Further, registration holes 28 (second registration holes) corresponding to through holes nearly equal in size to alignment holes 22 are formed at the same positions as those of the alignment holes 22 formed in the semiconductor wafer 21.

Incidentally, the thickness of each bump forming mask 26 of the present embodiment is about 20 μm.

The bumps 15 formed on the back surface 11b side of the semiconductor chip 11 according to the present embodiment are formed so as to protrude from the insulating sheet 42, whereas the bumps 15 formed on the front surface 11a side are formed in a state in which side faces thereof are surrounded by the insulating sheet 42 and only end faces thereof are exposed.

A method for manufacturing the semiconductor chips according to the present embodiment will be explained below in accordance with processes indicated in FIG. 7A to 7G.

Figure 7A:
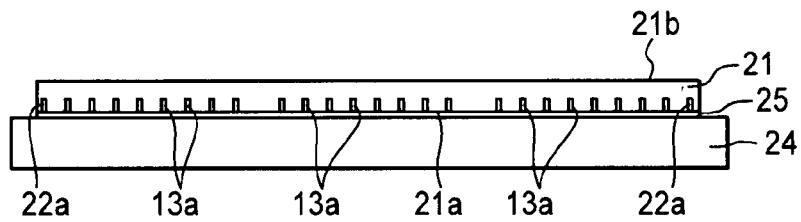
FIGS. 7A-7G are explanatory diagrams depicting a method for manufacturing the semiconductor chips according to the second embodiment.
Figure 7B:
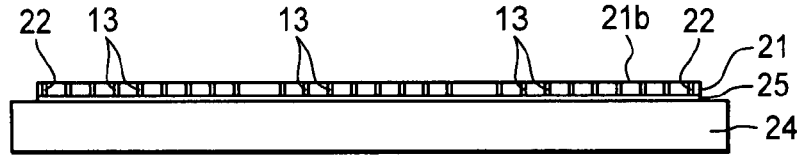
Figure 7C:
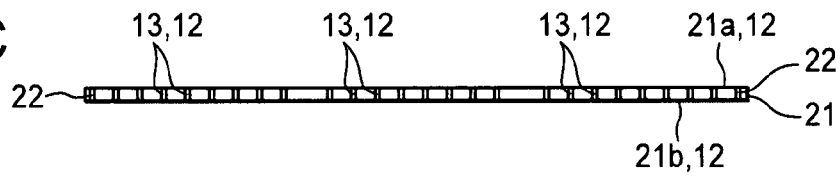

Since the operations of processes in FIG. 7A through FIG. 7C of the present embodiment are similar to the operations of the processes in FIG. 7A through FIG. 7C of the first embodiment, their description will be omitted.

Figure 7D:
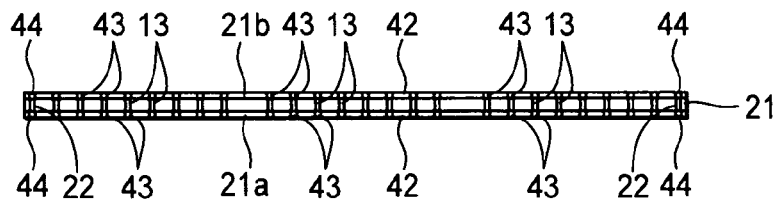

In FIG. 7D, the insulating sheets 42 are superimposed on their corresponding front and back surfaces 21a and 21b of the semiconductor wafer 21 formed at the process in FIG. 7C by optical alignment using the registration holes 44 and the alignment holes 22 formed in the semiconductor wafer 21. The insulating sheets 42 are pressed to laminate the insulating sheets 42 onto the front and back surfaces 21a and 21b of the semiconductor wafer 21 tentatively.

Figure 7E:
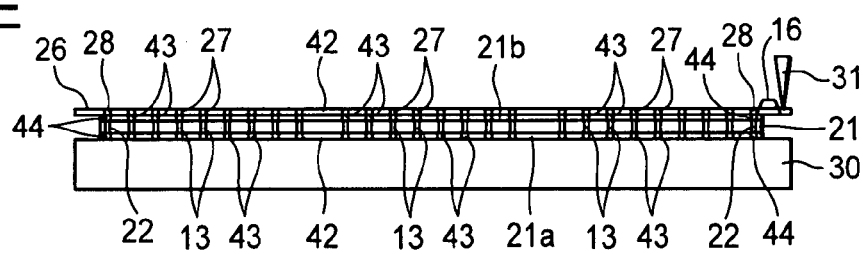

In FIG. 7E, the semiconductor wafer 21 in which the insulating sheets 42 are laminated on the front and back surfaces thereof with the side of one surface, e.g., front surface 21a of the semiconductor wafer 21 directed toward a stage 30, is placed on the stage 30. The bump forming mask 26 is superimposed on the insulating sheet 42 on the back surface 21b side by optical alignment using registration holes 28 formed in the bump forming mask 26 and their corresponding registration holes 44 of the insulating sheet 42. These are pressed to the stage 30 to place on the stage 30, the semiconductor wafer 21 in which the insulating sheets 42 are laminated on the front and back surfaces thereof and the bump forming mask 26 is overlaid on the insulating sheet 42 on the back surface 21 side.

At this time, the openings 43 of the insulating sheets 42 provided on the front and back surfaces, and the bump holes 27 of the bump forming mask 26 on the back surface 21b side are respectively brought into alignment with such positions as to internally include the electrode forming holes 13 formed in the semiconductor wafer 21, by alignment using the registration holes 44 and 28 and alignment holes 22.

In a manner similar to the process in FIG. 3D of the first embodiment, conductive paste 16 applied onto the bump forming mask 26 is enlarged, using jub 31, so as to be embedded into the openings 43 of the insulating sheet 42 laminated on the front surface 21a, the electrode forming holes 13 of the semiconductor wafer 21, the openings 43 of the insulating sheet 42 laminated on the back surface 21b, and the bump holes 27 of the bump forming masks 26 superimposed thereon.

Figure 7F:
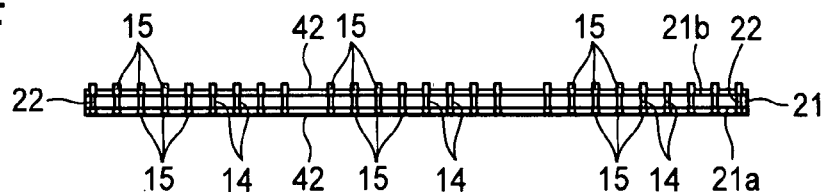

In FIG. 7F, the pressing against the two insulating sheets 42, and the bump forming masks 26 and semiconductor wafer 21 placed over the stage 30 is released to detach the insulating sheets 42, bump forming masks 26 and semiconductor wafer 21 with the conductive paste 6 embedded therein from on the stage 30. After the bump forming mask 26 is detached from the insulating sheet 42 on the back surface 21b side of the semiconductor wafer 21, the conductive paste 16 is cured by heat treatment or annealing to form through electrodes 24 extending through the semiconductor wafer 21 and bumps 15 connected to their corresponding end faces on the front surface 21a side and the back surface 21b side.

At this time, the insulating sheets 42 are firmly laminated on the front and back surfaces 21a and 21b of the semiconductor wafer 21 simultaneously. Further, the bumps 15 that protrude from the insulating sheet 42 are formed on the back surface 21b side of the semiconductor wafer 21, and the bumps 15 whose side faces are surrounded by the insulating sheet 42 are formed on the front surface 21a side.

Figure 7G:
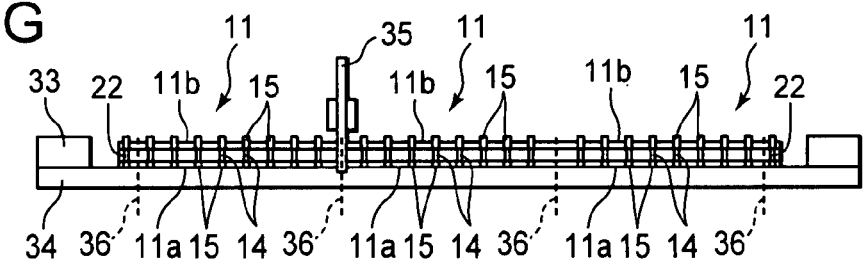

In FIG. 7G, the semiconductor wafer 21 formed at the process in FIG. 7F laminated onto a dicing tape 34 is divided into fractions in units of the semiconductor chips 11 in a manner similar to the process in FIG. 3F of the first embodiment.

Thereafter, the fractionalized semiconductor chips 11 are peeled off from the dicing tape 34 to form the semiconductor chip 11 shown in FIG. 6.

The semiconductor chips 11 manufactured in this way are stacked on the front surface 2a side of the lower substrate 2.

A method for manufacturing a semiconductor device according to the present embodiment will be explained below in accordance with processes indicated in FIG. 8A to 8C.

Figure 8A:
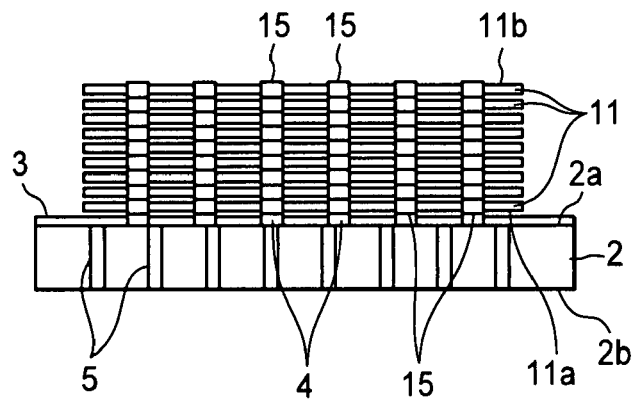
FIGS. 8A-8C are explanatory diagrams showing a method for manufacturing the semiconductor device according to the second embodiment.

In FIG. 8A, a lower substrate 2 similar to that at the process in FIG. 4A of the first embodiment is prepared. Bumps 15 formed on the side of one surface, e.g., front surface 11a of a semiconductor chip 11 are placed on their corresponding connecting terminals 4 in alignment. A semiconductor chip 11 of the bottom layer is stacked on the lower substrate 2. Bumps 15 on the front surface 11a side of a semiconductor chip 11 corresponding to a second layer are laminated onto their corresponding bumps 15 on the back surface 11b side of the semiconductor chip 11 of the bottom layer. The stacking of the semiconductor chips 11 is sequentially repeated to stack a plurality of semiconductor chips 11 on the front surface 2a side of the lower substrate 2.

Figure 8B:
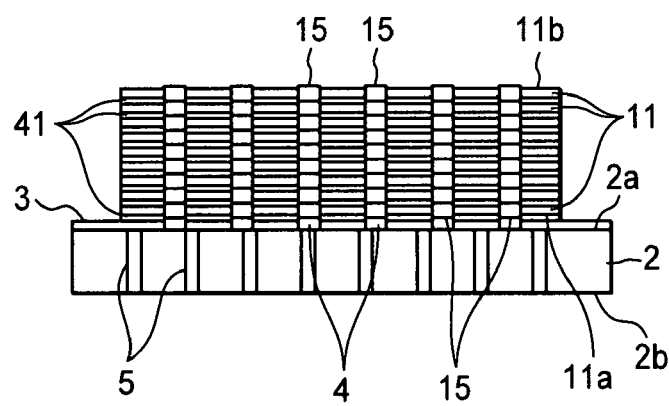

In FIG. 8B, the lower substrate 2 and the semiconductor chips 11 stacked on the lower substrate 2 are fixed by a jig or the like and carried in an unillustrated high-temperature bath. This is heated to perfectly cure the connecting terminals 4 and bumps 15 of the lower substrate 2, the respective bumps 15, an insulating layer 3 of the lower substrate 2 and insulating sheets 42, and the insulating sheets 42 and to deposit or weld the insulating layer of the lower substrate 2 and the insulating sheets 42, and the insulating sheets 42, thereby forming insulating resin layers 41.

Thus, the laminated semiconductor chips 11, and the semiconductor chip 11 of the bottom layer and the lower substrate 2 are bonded to one another by adhering action of the insulating resin layers 41 and insulation is made between their bonded bumps 15 in the plane direction.

Figure 8C:
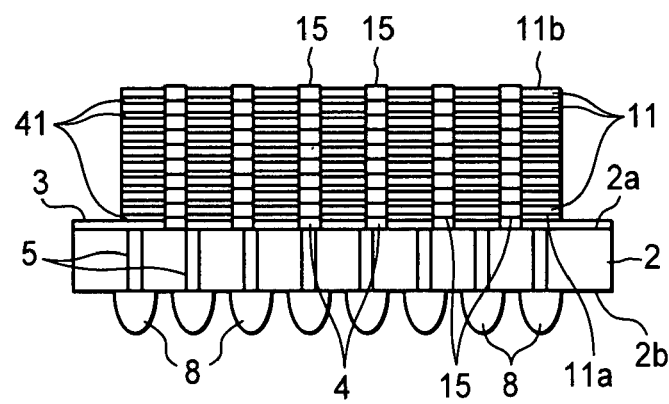

In FIG. 8C, the semiconductor device 1 formed with the insulating resin layers 41 is taken out from the high temperature bath after the cooling of the insulating resin layers 41, and external terminals 8 connected to their corresponding through plugs 5 are formed in a manner similar to the process in FIG. 4D of the first embodiment.

The semiconductor device 1 in which a plurality of the semiconductor chips 11 are stacked over the lower substrate 2 shown in FIG. 5 is manufactured in this way.

In each semiconductor chip 11 according to the present embodiment as described above, the semiconductor wafer 21 is brought into thin-plate form by grinding and peeled off from an adhesive layer 25. Thereafter, conductive paste 16 is embedded using the insulating sheets 42 and bump forming masks 26 to form the bumps 15 and through electrodes 14. Therefore, it is possible to prevent dropping off of the bumps 15 and cracking of the semiconductor wafer 21 and enhance the yields of the semiconductor wafer 21 for manufacturing the thinned semiconductor chips 11 in a manner similar to the first embodiment.

Since alignment holes 22 are provided in the semiconductor wafer 21 and registration holes 44 and 28 are provided in the insulating sheets 42 and bump forming masks 26, respectively, the alignment between openings 43 of the insulating sheets 42 and bump holes 27 of the bump forming masks 26, and electrode forming holes 13 of the semiconductor wafer 21 can be done with satisfactory accuracy. Poor connections between the through electrodes 14 and the bumps 15 due to position displacements are prevented. Thus, the bumps 15 excellent in position accuracy can be formed.

Further, the insulating sheets 42 are laminated on the front and back surfaces of the semiconductor wafer 21, and the bump forming mask 26 is superimposed on one insulating sheet 42 thereof. After the conductive paste 16 is embedded, the bump forming masks 26 are detached and the bumps 15 are formed oh the front and back surfaces of the semiconductor wafer 21. Therefore, the flattening or planarizing process of end faces of the bumps 15, such as the back surface flattening step or the like becomes unnecessary, and the manufacturing process of each semiconductor chip 11 can be simplified.

Further, after the semiconductor chips 11 are stacked over the lower substrate 2, the insulating sheets 42 are deposited or welded on one another by heat treatment to form the insulating layers 41. Therefore, an underfill process step becomes unnecessary and the manufacturing process of the semiconductor device 1 can be simplified.

In the present embodiment as described above, in addition to the effects similar to the first embodiment, the insulating sheets each having the opening of such a size as to internally include each electrode forming hole are laminated or bonded onto the front and back surfaces of the semiconductor wafer. The bump forming mask is superimposed on one insulating sheet thereof to form the bumps in the front and back surfaces of the semiconductor wafer. This is divided into fractions, thereby manufacturing the semiconductor chips. By doing so, the insulating resin layers for insulating the semiconductor chips or the like can easily be formed by stacking the semiconductor chips on one another and heat-treating the same. Thus, the underfill process step in the manufacturing process of the semiconductor device in which the semiconductor chips are stacked over the lower substrate, can be omitted, and hence the manufacturing process of the semiconductor device can be simplified.

Incidentally, although the present embodiment has explained the case in which the bumps that protrude from the insulating sheet are formed on the back surface side of each semiconductor chip, the bumps that protrude from the insulating sheet may be formed on the front surface side of the semiconductor chip, and the bumps whose side faces are surrounded by the insulating sheet may be formed on the back surface side.

Although the respective embodiments have explained the lower substrate employed in the manufacture of the semiconductor device as the individually divided lower substrate, it may be allowed to laminate semiconductor chips on respective lower substrates in a manner similar to the above over a wafer formed with the lower substrates in plural form, using the wafer, divide the wafer into fractions in units of the lower substrates after the formation of external terminals in the lower substrates and thereby manufacture a semiconductor device. Alternatively, a semiconductor device may be manufactured in a manner similar to the above using an assembly of strip-shaped lower substrates, in which a plurality of the lower substrates are disposed in matrix form or linearly.

Although each of the embodiments has explained the case in which the semiconductor chips are stacked over the lower substrate with the front surface sides of the semiconductor chips being directed toward the lower substrate side, the semiconductor chips may be stacked with the back surface sides of the semiconductor chips being directed toward the lower substrate side.

Further, although each of the embodiments has explained the case in which the semiconductor wafer and the bump forming masks or insulating sheets are brought into alignment optically, the alignment may be done mechanically using pins or the like fit in alignment holes. Alternatively, the formation of the alignment holes and registration holes are omitted, and the alignment may be done by image processing or the like using the electrode forming holes and the bump holes or openings.

Furthermore, although each of the embodiments has described the lower substrate as the plate-like member formed of silicon, a plate-like member formed of a glass epoxy resin or the like containing glass fiber may be used.

While the preferred forms of the present invention have been described, it is to be understood that modifications will be apparent to those skilled in the art without departing from the spirit of the invention. The scope of the invention is to be determined solely by the following claims.

What is claimed is:

1. A method for manufacturing a semiconductor chip having through electrodes, comprising the steps of:

forming, in a semiconductor wafer having front and back surfaces formed with circuits, a plurality of electrode forming holes for forming the through electrodes;

superimposing bump forming masks formed with a plurality of bump holes over the front and back surfaces of the semiconductor wafer respectively in such a manner that the electrode forming holes and the bump holes are brought into alignment;

placing the semiconductor wafer with the bump forming masks superimposed thereon over a stage;

embedding conductive paste into the bump holes of the bump forming masks superimposed over the front and back surfaces and the electrode forming holes of the semiconductor wafer from the bump forming mask disposed over the surface on the side opposite to the stage, of the semiconductor wafer;

detaching the bump forming masks from the semiconductor wafer after the conductive paste has been embedded; and dividing the semiconductor wafer into fractions after the bump forming masks have been detached.

2. The method according to claim 1, wherein in the step of forming the electrode forming holes in the semiconductor wafer, alignment holes are formed in an outer peripheral edge of the semiconductor wafer simultaneously with the formation of the electrode forming holes, and wherein in the step of superimposing the bump forming masks over the front and back surfaces of the semiconductor wafer respectively, first registration holes are formed in the bump forming masks, and the electrode forming holes and the bump holes are brought into alignment by optically aligning the alignment holes of the semiconductor wafer and the first registration holes of the bump forming masks with one another.

3. The method according to claims 1, wherein the step of forming the electrode forming holes includes a step of forming a plurality of deep holes in the semiconductor wafer from the front surface side, and a step of grinding the semiconductor wafer from the back surface side after the formation of the deep holes thereby to form a plurality of electrode forming holes.

4. The method according to claims 1, wherein each of the bump forming masks comprises a metal plate.

5. The method according to claims 1, wherein each of the bump forming masks has a diameter larger than that of the semiconductor wafer.

6. The method according to claims 1, wherein the step of placing the semiconductor wafer over the stage is a step of placing the semiconductor wafer over the stage in such a manner that the front surface assumes a surface on the stage side.

7. A semiconductor device in which the semiconductor chip described in claims 1 is stacked over a lower substrate in plural form.

8. A method for manufacturing a semiconductor chip having through electrodes, comprising the steps of:
   forming, in a semiconductor wafer having front and back surfaces formed with circuits, a plurality of electrode forming holes for forming the through electrodes;
   laminating insulating sheets each having a plurality of openings over the front and back surfaces of the semiconductor wafer respectively in such a manner that the electrode forming holes and the openings are brought into alignment;
   placing the semiconductor wafer with the insulating sheets laminated thereon over a stage;
   superimposing bump forming masks formed with a plurality of bump holes over the insulating sheets disposed over the surface on the side opposite to the stage, of the semiconductor wafer in such a manner that the openings and the bump holes are brought into alignment;
   embedding conductive paste into the bump holes of the bump forming masks, the openings of the insulating sheets laminated over the front and back surfaces, and the electrode forming holes of the semiconductor wafer from the bump forming mask side;
   detaching the bump forming masks from the semiconductor wafer after the conductive paste has been embedded; and
   dividing the semiconductor wafer into fractions after the bump forming masks have been detached.

9. The method according to claim 8, wherein in the step of forming the electrode forming holes in the semiconductor wafer, alignment holes are formed in an outer peripheral edge of the semiconductor wafer simultaneously with the formation of the electrode forming holes, and
   wherein in the step of laminating the insulating sheets over the front and back surfaces of the semiconductor wafer respectively, second registration holes are formed in the insulating sheets, and the electrode forming holes and the openings are brought into alignment by optically aligning the alignment holes of the semiconductor wafer and the second registration holes with one another.

10. The method according to claim 9, wherein in the step of superimposing the bump forming masks over the insulating sheets, first registration holes are formed in the bump forming masks, and the openings and the bump holes are brought into alignment by optically aligning the second registration holes of the insulating sheets and the first registration holes of the bump forming masks with one another.

11. A semiconductor device in which the semiconductor chip described in claims 8 is stacked over a lower substrate in plural form with the insulating sheets welded thereto.

\* \* \* \* \*